US006867132B2

(12) United States Patent
Perlov et al.

(10) Patent No.: US 6,867,132 B2
(45) Date of Patent: Mar. 15, 2005

(54) LARGE LINE CONDUCTIVE PADS FOR INTERCONNECTION OF STACKABLE CIRCUITRY

(75) Inventors: Craig Perlov, San Mateo, CA (US); Carl Taussig, Woodside, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/245,897

(22) Filed: Sep. 17, 2002

(65) Prior Publication Data

US 2004/0053497 A1 Mar. 18, 2004

(51) Int. Cl.[7] .............................................. H01L 21/44
(52) U.S. Cl. ....................... 438/666; 438/670; 438/761
(58) Field of Search ................. 438/652, 666, 438/670, 761, 780; 216/24

(56) References Cited

U.S. PATENT DOCUMENTS

| | | | | |
|---|---|---|---|---|
| 5,772,905 A | * | 6/1998 | Chou | 438/691 |
| 6,251,297 B1 | * | 6/2001 | Komuro et al. | 216/24 |
| 6,375,870 B1 | * | 4/2002 | Visovsky et al. | 216/24 |
| 6,407,340 B1 | | 6/2002 | Wikstrom et al. | |
| 6,426,880 B1 | | 7/2002 | Chen | |
| 6,518,189 B1 | * | 2/2003 | Chou | 438/706 |
| 6,552,409 B2 | * | 4/2003 | Taussig et al. | 257/529 |
| 6,599,796 B2 | * | 7/2003 | Mei et al. | 438/243 |
| 2002/0039847 A1 | | 4/2002 | Clayton | |

FOREIGN PATENT DOCUMENTS

FR          2515917          5/1983

OTHER PUBLICATIONS

Juskey, F. et al. "Cross Hatched Pad Design for Bonding EL Panels to PCB's using Z–Axis Adhesives", Motorola Tech. Develop., Motorola Inc., Schaumburg, IL., US, vol. 19 Jun. 1, 1993.

* cited by examiner

Primary Examiner—Kevin M. Picardat

(57) ABSTRACT

Digital circuitry, such as interconnective pads which are patterned as waffles according to the embossing methods for flexible substrates which are disclosed, so as to be especially suited for the interconnection of stacks of circuitry blocks forming digital memory known as Permanent Inexpensive, Rugged Memory (PIRM) cross point arrays.

6 Claims, 2 Drawing Sheets

LARGE LINE CONDUCTIVE PADS FOR INTERCONNECTION OF STACKABLE CIRCUITRY

FIELD OF THE INVENTION

The present invention relates to the field of producing circuitry such as conductive pads for electrical interconnection of digital memory. More specifically, the invention relates to the provision of large line conductive pads produced according to emboss and lift off methods which pattern thin films on flexible substrates.

BACKGROUND OF THE INVENTION

Attempts have been made for mass scale production of certain types of digital circuitry such as interconnection pads and digital memory by the patterning of thin films of metals and semiconductor on flexible plastic webs in a roll-to-roll production environment. However, plastic web production of such circuitry is currently plagued by deficiencies inherent in the actual patterning methods utilized on flexible substrates. Specifically, existing patterning solutions, such as screen print and ink jet, photolithography, and laser ablation each have deficits in resolution and/or throughput, and can also cause collateral damage. In particular, screen print or inkjet based patterning schemes yield a relatively low throughput, and limited ability to pattern a wide range of materials with uniform standards of resolution. Photolithography, laser ablation, or other optically based patterning methods yield a relatively low throughput, higher capital cost, and low resolution on flexible substrates. This is because the resolution of such optically based schemes is limited by diffraction in proportion to $$\frac{\lambda}{NA},$$

where $\lambda$ is the wavelength of the illumination and NA is the numerical aperture of the imaging system. Given that the depth of field for the imaging system, and hence its ability to deal with surface irregularities is limited by $$\frac{\lambda}{NA^2},$$

at some point it becomes very difficult to resolve small features on a flexible substrate with such methodologies. This is because it is difficult to clamp a flexible substrate with a vacuum or electrostatic chuck without attracting dust particles to the chuck or substrate surface, or without introducing surface irregularities, especially given the surface roughness typical of flexible webs.

Emboss and liftoff techniques can provide a low cost patterning method for circuitry which has a comparatively high resolution and high throughput when produced on flexible substrates. Despite the advantages of emboss and lift off techniques, several problems do limit its utility for producing electronics which require the large area interconnection pads which offer the advantages of less restrictive tolerance requirements during stacking alignments. In order to use the emboss and lift off process in the manufacture of wide area circuitry such as Permanent Inexpensive, Rugged Memory (PIRM) memory layers, it must be able to provide terminating pads on the end of the electrodes with radii of at least 50 microns. Such terminating pads are required for multi layer interconnect, but the basic emboss and lift off techniques cannot replicate features of this size.

As such, in order to adequately provide for the different types of digital circuitry needed in memory modules, such as the PIRM type memory in certain digital consumer devices, there is a need for the high resolution and throughput of the embossing process when patterning on flexible web sheet substrates without the limitations on producing large area terminating pads.

SUMMARY OF THE INVENTION

In accordance with the principles of the present invention, there are provided techniques for producing different types of digital circuitry for use in memory modules, such as large line conductive pads for interconnection of stackable circuitry in PIRM cross-point memory arrays.

In particular, the invention overcomes the different limitations of the various prior art patterning methods for flexible substrates and the shortcomings of the prior art embossing for production of digital circuitry such as termination pads by introducing the concept of a waffle pad embossing process. One form of the invention provides for the producing of row and column electrodes for terminating pads of stackable PIRM cross point memory arrays. Provision of such electrodes permits a terminating pad to be subdivided into a set of electrically connected, crosshatched intersecting features which individually satisfy the design rule for successful lift off of patterns, even for large area pads, such as those in excess of 100 microns in diameter. The inventive waffle patterning allows for the use of many of the different lithographic techniques which were previously limited in producing large area circuitry. Also, the process complexity of a PIRM module can be significantly lowered by the use of emboss and liftoff ("embossing") as a patterning method for flexible substrates within the module. In one embodiment, the conductive pads are produced in a plastic web based roll to roll environment, according to an improved waffle structure or patterning which provides the traditional benefits of high definition and throughput of embossing and lift off techniques, all while overcoming the traditional limitations of emboss and lift techniques pertaining to the problem of the maximum size limitation The present invention therefore satisfies, through the inventive waffle pad embossing process, the need for PIRM cross point memory arrays to have economically produced, high resolution conductive pads which offer a large area of electrically continuous material to allow for alignment tolerances for any given layer to layer interconnect.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

Figure 1:
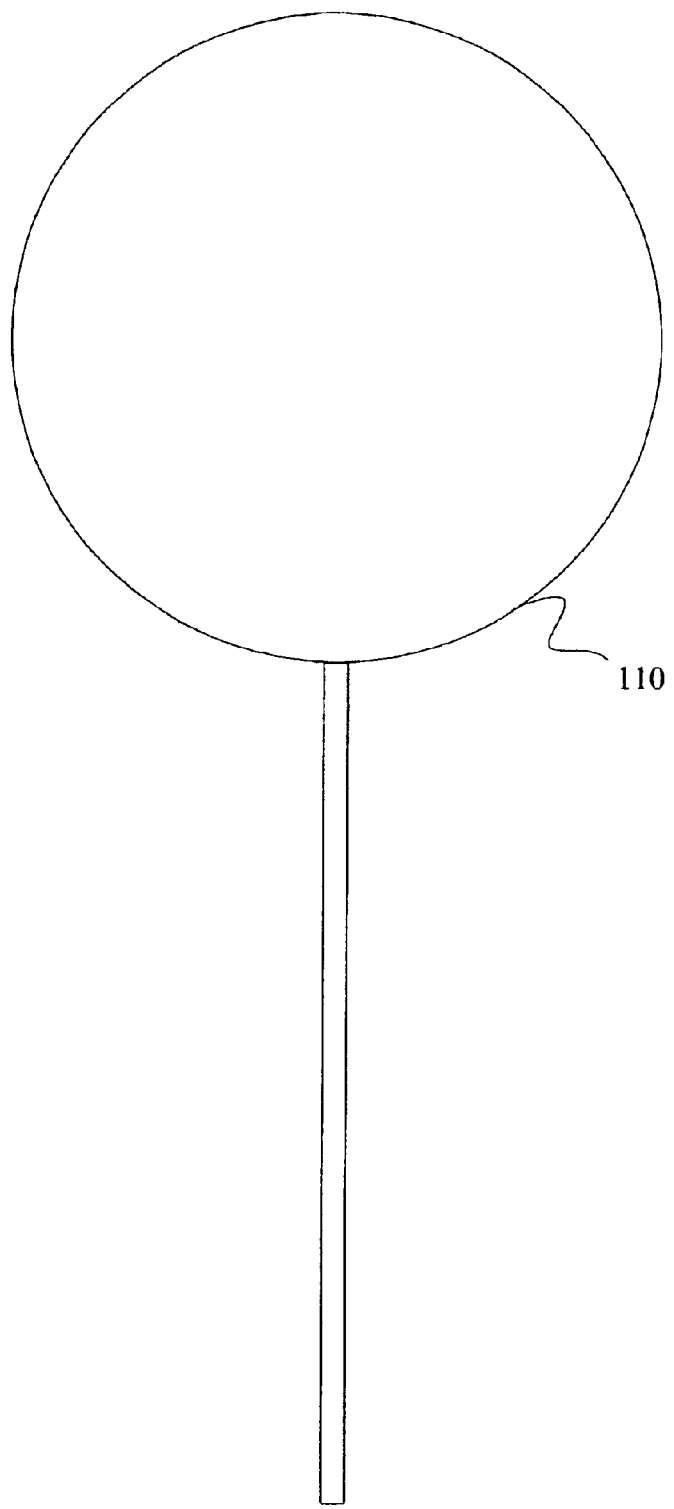
FIG. 1 is a pictorial diagram of a termination pad utilized for interconnection between circuitry layers in a digital memory system in the prior art.

The inventive techniques disclosed herein are applicable to several types of digital circuitry. By way of one exemplary embodiment, the inventive techniques for producing digital circuitry are disclosed within the context of one type of digital circuitry: large area line conductive pads. Large area line conductive pads are typically used for interconnection of stackable circuitry in a Permanent Inexpensive, Rugged Memory (PIRM) cross-point memory arrays, can be produced according to different methods of lithography, and in one preferred embodiment, can be fabricated on a plastic web based roll to roll environment according to an improved emboss and lift technique are disclosed in U.S. application Ser. No. 10/244,862, entitled "Embossed Mask Lithography," the disclosure of which is hereby incorporated by reference. In the following description, for purposes of explanation, specific nomenclature and specific implementation details are set forth to provide a thorough understanding of the present invention. However, it will be apparent to one skilled in the art that these specific details are not necessarily required in order to practice the present invention.

Large area conductive pads are typically used within the digital circuitry environment of current consumer devices. This is because many consumer devices such as digital cameras (still and/or moving picture), digital music players/recorders (e.g. MP3 players), personal digital assistants (PDAs), mobile telephones, and the like are now constructed to generate and/or utilize digital data in increasingly large quantities, something which requires interconnection of digital circuitry, especially for interconnection between stackable memory. In particular, portable digital cameras for still and/or moving pictures, for example, generate large amounts of digital data representing images, such that each digital image may require up to several megabytes (MB) of data storage, and such storage must be available in the camera. Given this, present digital consumer devices require specialized storage memory to accommodate the large quantities of digital data, and need interconnected digital circuitry in order to build the necessary memory.

However, in order to provide for this type of data storage application, storage memory should be: (1) relatively low in cost for sufficient capacities of around 10 MB to 1 gigabyte (GB); (2) low in power consumption (e.g. <<1 Watt); (3) have relatively rugged physical characteristics to cope with the portable battery powered operating environment; (4) and should preferably have a short access time (ideally less than one millisecond) and moderate transfer rate (e.g. 20 Mb/s), yet be able to be packaged in an industry standard interface module, such as PCMCIA or Compact Flash card. The limitations of the current industry standard FLASH memory, such as high cost and relatively low capacity for broad utilization in the above described applications, are well known, and as such, recent advances have provided for a type of memory module termed "PIRM" (Portable Inexpensive Rugged Memory), which addresses the problem of low cost archival storage for digital camera and other portable appliances. The benefits of PIRM memory comport with the needs of high capacity memory in consumer devices above (e.g., an industry standard interface such as PCMCIA or Compact Flash, 2000 G shock tolerance, low power consumption (<<1 W), short access time (<1 ms), moderate transfer rate (20 Mb/s), and sufficient capacity (10 MB–1GB)). In addition, PIRM memory modules can offer lower cost by avoiding silicon substrates, by lowering areal density, and by minimizing process complexity.

Moreover, PIRM memory modules are a write once storage device which offer higher capacity for a given interface card form factor by virtue of placing multiple interconnected layers of circuitry or storage within a single module. Because a single electrode, without any terminating pad, offers little conduction area for interlayer connection, the layers are connected through the use of at least one interconnective or terminating pad (illustrated at FIG. 1) connected to the end of an electrode. In addition, these interconnection pads generally need to have at least a 100-micron diameter (50 micron radius) in order to provide a large enough electrically continuous material to allow for reasonable alignment tolerances when aligning the different stackable layers of circuits. This is problematic in prior art solutions, because creation of large electrically continuous areas, whether for interconnection pads, or other digital circuitry, can be very expensive and need to be produced on a mass scale.

Conductive Pads In Stacked Circuitry of Digital Memory Systems

When manufacturing PIRM memory layers for digital memory systems, interconnection or conductive pads are often required on the end of electrodes in stackable circuitry. This is because a typical PIRM memory module is formed of a plurality of layers each having a cross-point memory array. Many layers can be stacked to form a single memory module, allowing the memory module to have a storage capacity of many multiples of the data storage possible on a single layer. Construction of a PIRM memory module therefore involves the stacking of multiple layers of memory into an interconnected three-dimensional storage module. U.S. patent application Ser. No. 09/875,356, entitled "Non-Volatile Memory," details the technology involved in providing the improved stackable circuitry in PIRM memory modules as referenced throughout, while U.S. patent application Ser. No. 09/875,833, entitled "Digital Camera Memory System," details the generally referenced PIRM based digital memory systems for consumer devices. The disclosures of both documents are explicitly incorporated herein by reference. Conductive pads are found within PIRM memory modules where both the stackable circuitry and the conductive pads are produced using simple and inexpensive processing. Through use of a flexible plastic or metal substrate, roll to roll processing is possible in fabrication of the circuits on the layers. Conductive pads are thereby formed on the substrate for the making of external connection to the various layers of stackable circuits. A plurality of the layers are stacked on top of one another and laminated together. The memory module is then completed by forming and pattering external contact tracks that make electrical contact with the conductive pads at the edges of the memory module layers.

However in order to reduce the tolerances when stacking, large area circuitry is required. As such, the conductive pads must have a radius of at least 50 microns in order to effectively perform their function of serving as interconnects between the multiple layers. More specifically, it is desirable for conductive pads (e.g. 110 in FIG. 1) to be relatively wide (in the range of several hundred microns wide) in so as to allow for easier alignment of interconnects between layers in the memory module. However, as previously mentioned, in the various prior art emboss procedures (whether involving lift off or non-lift off steps) there is a maximum feature size limitation, or limit to the width of an embossed region that can be created when fabricating sensors, capacitors, and interconnection pads.

For example, in non-lift off based processes, such as those described in U.S. patent application Ser. No. 10/058,744, entitled "Optical-Mechanical Feature Fabrication During Manufacture Of Semiconductors And Other Micro-Devices and Nano-Devices That Include Micron And Sub-Micron Features," the specification of which is hereby incorporated by reference, embossing a pattern with large features and small features is difficult because of "capillary" action whereby an applied polymer is wicked into the small (narrow) feature areas, thereby starving the large feature areas of the needed polymer. The practical result of this uneven polymer settlement is that the smaller (narrower) areas may have a higher polymer profile compared to the wider areas. Similarly, in lift off based processes, embossing a pattern with large features (e.g., a wide area) is problematic because the pressure sensitive adhesives which are typically used in the lift off step may adhere not to only the peaks, but may also sag into the trenches, thereby inadvertently adhering to and removing desired depositions from the trench floor. Given the described maximum feature size limitation on the different embossing procedures, there is a need to apply the inventive concept of waffling to all of the various embossing processes, whether lift off or non-lift off based.

The inventive techniques address the aforementioned limitations in the known embossing techniques by subdividing a large conductive pad into a set of cross hatched intersecting features which individually satisfy both the design rule for successful lift off, as well as the even polymer settlement requirements in non-lift off embossing techniques. The subdivision can be maximized by establishing an acceptable width based on the factors which affect the above described capillary actions and the sagging actions. The width at which these phenomenon manifest themselves is well known in the art, but generally depend on several factors. In the lift off based embossing, the ideal width characterizing the subdivision depends on at least the following factors, such as (1) the thickness and ensuing compliance of the substrate(s); and (2) the aspect ratio of width to the depth of the layering features, where generally speaking, the greater aspect depth, when compared to the aspect width, affording the least sag problems. In the non-lift off based embossing, the ideal width characterizing the subdivision depends on at least the following factors, such as (1) the viscosity of liquefied polymer; and (2) the aspect ratio of width to depth, which effects the capillary action rate and propensity.

Thus, in order to overcome the above difficulties, the area is selectively patterned. In any embodiment, this selective patterning provides for either a regular or irregular array of conductive areas. In the preferred embodiment, a regular array is patterned such that there is a cross hatching so as to subdivide the overall embossed area according to the necessary width, as established from the above factors. The preferred resulting pattern then resembles a waffle, and accordingly satisfies the need to have a large area of electrically continuous material to allow for reasonable alignment tolerances during the layer to layer interconnect. In addition, this waffle pattern also provides a greater area of conductors, when compared to a single electrode without a terminating or conductive pad, something which can improve the yield of the layer to layer interconnect process. By way of one exemplary embodiment, each of the conductors may, have say, a width anywhere in the range of 1–3 microns (with the gaps or trenches in between each having the same width dimensions as the conductors), while the preferable conductive pad width or diameter may be on the order of several hundreds of microns, with a minimum width or diameter of 100 microns. When structured thusly, the inventive waffle pattern avoids all of the previously described difficulties inherent in straight emboss and lift techniques known in the art of web processing of large line conductive pads.

Figure 2:
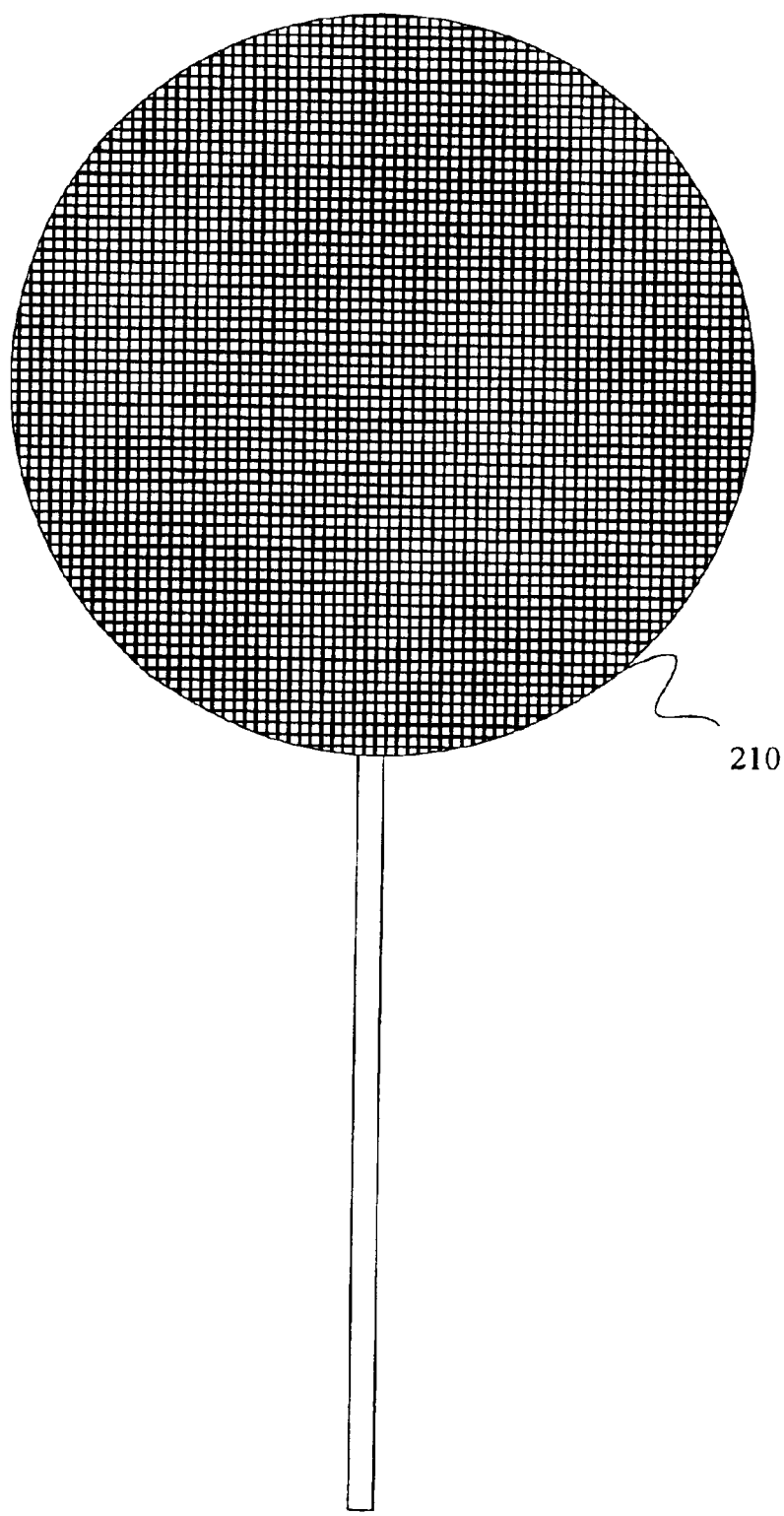
FIG. 2 is a pictorial diagram of an example of the novel waffle pattern type large area termination pad utilized for interconnection between circuitry layers in a digital memory system in the present invention.

The inventive conductive pad(s) 210, as depicted in FIG. 2, may then be formed according to either a straight (one layer) waffle pattern embossing, or may be formed from two layered groupings, each layered grouping having a series of substantially parallel conductors which are crossed so as to be substantially orthogonal to the other layered grouping. Of course, the present invention also contemplates the provision conductive pads from the irregular array patterning of non-substantially waffle shaped patterns that are nevertheless electrically continuous. Although not as effective as waffle based patterning, such electrically continuous patterns might overcome some of the limitations of non-waffle shaped emboss and lift off process by providing non-conductive pillars to prevent say, adhesive from lifting off conductive materials at the bottom of trenches.

The foregoing detailed description of a preferred embodiment of the present invention is presented by way of example only, and many variations to the circuits, structures, arrangements and processes described are possible without departing from the scope of the invention. It will be readily recognized however, that the structure of the conductive pad also has many possible variations while retaining the principles of the present invention. In the described embodiment, a rounded pad could alternatively be other shapes, with varying numbers of conductors which satisfy the previously described lift off rule.

The principles of the present invention can be applied with many other variations to the circuits, structures, arrangements and processes described herein, as will be apparent to those of ordinary skill in the art, without departing from the scope of the invention as defined in the appended claims.

We claim:

1. A method for creating a circuit, comprising the steps of:
   molding a waffle pattern into a stamp;
   utilizing said stamp to create a mask having a representation of said waffle pattern; and
   molding said stamp such that said waffle patterned stamp and said created mask represent a large circuit element in proximity to a small circuit element.

2. The method of claim 1, wherein a size ratio of said large circuit element to said small circuit element is at least 10 to 1.

3. The method of claim 1, wherein a width of said small circuit element is represented by a variable "d" and wherein a waffle pattern of said large circuit element is created by subdividing an area of said large circuit element into sections having a width equal to "d".

4. The method of claim 3, wherein said sections of said large circuit element waffle pattern have a length equal to "d".

5. The method of claim 1, wherein said large circuit element is at least one of a pixel, a bond pad, and a capacitor.

6. The method of claim 1, wherein said small circuit element is at least one of a transistor, a resistor, and a line.

* * * * *